United States Patent [19]

Pike, Jr.

[11] Patent Number: 4,789,886

[45] Date of Patent: Dec. 6, 1988

[54] METHOD AND APPARATUS FOR INSULATING HIGH VOLTAGE SEMICONDUCTOR STRUCTURES

[75] Inventor: Douglas A. Pike, Jr., Cupertino, Calif.

[73] Assignee: General Instrument Corporation, New York, N.Y.

[21] Appl. No.: 5,412

[22] Filed: Jan. 20, 1987

[51] Int. Cl.[4] .................... H01L 29/78; H01L 27/04; H01L 29/40

[52] U.S. Cl. ................................. 357/53; 357/23.8; 357/23.11; 357/50; 357/52; 357/54

[58] Field of Search .................... 357/23.8, 23.11, 52, 357/53, 54, 50, 35

[56] References Cited

U.S. PATENT DOCUMENTS

| 4,224,636 | 9/1980 | Yonezawa et al. | 357/52 |
| 4,271,582 | 6/1981 | Suirai et al. | 357/52 |
| 4,412,242 | 10/1983 | Herman et al. | 357/52 |

FOREIGN PATENT DOCUMENTS

| 60-260150 | 12/1985 | Japan | 357/53 |
| 2077494 | 12/1981 | United Kingdom | 357/23.8 |

OTHER PUBLICATIONS

*J. Vac. Sci. Technol.*, vol. 17, No. 4, Jul./Aug. 1980, S. P. Murarka, "Refractory Silicides . . . ", pp. 776–792.
"Surface Breakdown in Silicon Planar Diodes Equipped with Field Plate", by F. Conti and M. Conti, *Solid–State Electronics*, 1972, vol. 15, pp. 93–105.
"Design Considerations for High-Voltage Overlay Annular Diodes", by Demir S. Zoroglu and Lowell E. Clark, *IEEE Transactions on Electron Devices*, vol. ED–19, No. 1, Jan. 1972.
"Enhancement of Breakdown Properties of Overlay Annular Diodes by Field Shaping Resistive Films", by L. E. Clark and D. S. Zoroglu, *Solid–State Electronics*, 1972, vol. 15, pp. 653–657.
"Motorola Semiconductor Technical Data", Specification Sheets, Motorola, Inc., 1985, 4 pages.
Page 597 of article in *IEEE Journal of Solid–State Circuits*, vol. SC–21, No. 4, Aug. 1986, referring to U.S. Pat. No. 4,553,041, issued Nov. 12, 1985.

*Primary Examiner*—Martin H. Edlow
*Assistant Examiner*—Donald J. Featherstone
*Attorney, Agent, or Firm*—Kramer, Brufsky & Cifelli

[57] ABSTRACT

A high voltage semiconductor includes an electrically floating conductive layer located adjacent the field oxide in the gap region between a junction pair. The electrically floating conductive layer allows free charge in the insulating layers to be dissipated. As a result, the depletion region in the substrate is extended and the breakdown voltage of the device is improved considerably.

7 Claims, 4 Drawing Sheets

4,789,886

METHOD AND APPARATUS FOR INSULATING HIGH VOLTAGE SEMICONDUCTOR STRUCTURES

TECHNICAL FIELD

The present invention relates to a method and apparatus for insulating high voltage structures within semiconductor devices, and more particularly to a method and apparatus for enhancing the breakdown voltage of semiconductor structures within the device using an electrically floating conductive layer.

BACKGROUND ART

Techniques for enhancing the breakdown voltage of high voltage semiconductor devices are well known in the art. In the past, a broad range of semiconductor devices including P-N junction diodes, bipolar and MOS transistors, and lateral PNP structures have been fabricated using a metal plate electric field termination technique. The metal field plate increases the diffused P-N junction breakdown voltage while being compatible with existing fabrication technology.

As is well known, electrical isolation between semiconductor device structures can be accomplished with insulating films formed on the top surface of the device or with annular rings diffused around the individual structures which are biased to selected electrical potentials, or a combination of both. With very high voltage devices, very intense electric fields with steep electric field gradients are created around the corners of the individual structures, resulting in breakdown voltages which are substantially less than the bulk values associated with the individual constituent materials. The insulation techniques developed to enhance the breakdown voltages in these devices usually require insulating films deposited in conjunction with a surrounding metal plate.

The well known basic concepts of metal field plate termination are detailed in "Surface Breakdown in Silicon Planar Diodes Equipped with Field Plate" by F. Conti and M. Conti, *Solid-State Electronics* 1972, Vol. 15. A simple example is a high voltage reverse biased junction diode. The diode comprises a P-type diffused base region in an N-type [111] silicon substrate forming a P-N junction. An annular guard ring is diffused into the substrate to encompass the high voltage base junction. A conventional field oxide is grown on the surface, extending from the base region to the guard ring. Additional insulating layers are typically deposited on the field oxide for passivation before metal contacts are deposited on both the base region and the guard ring. The guard ring itself is electrically biased, usually to the substrate potential.

It has also been found that a structure's breakdown voltage can be enhanced by overlaying both the guard ring and high voltage base region metal contact onto the field oxide structure. Both metal overlay regions extend out over the field oxide by a distance much larger than the junction depth. The gap across the field oxide is usually equivalent in length to the metal plate extension.

Although the structure described above provides improved performance, it is still unacceptable for certain applications. A problem with the prior art metal plate termination structures is that any charge (typically positive) found in the insulating film over the field oxide accumulates opposite charge (typically negative) at the insulator-field oxide interface due to capacitive plate effects. Corresponding image charges are formed at the field oxide-silicon substrate interface, thereby limiting the horizontal extent of the depletion region in the substrate along the field oxide substrate interface. As a result, the breakdown voltage of the high voltage function is lowered. In addition, during high temperature reverse bias testing of these structures, breakdown voltages will be further reduced due to additional charge accumulation from the external environment, such as from packaging materials and contamination on the device surface.

In an effort to minimize this effect, prior art structures are hermetically packaged or have various slightly conductive layers deposited between the overlaid metal contacts, which allows neutralizing charge to migrate in the layer and dissipate any accumulated charge. For example, in "Design Considerations for High-Voltage Overlay Annular Diodes", *IEEE Transactions on Electron Devices*, Vol. ED-19, No. 1, January 1972; and "Enhancement of Breakdown Properties of Overlay Annular Diodes by Field Shaping Resistive Films", *Solid-State Electronics*, 1972, Vol. 15; D. S. Zoroglu and L. E. Clark describe the use of slightly conductive, insulating films to be deposited in between the overlaid metal contacts on the field oxide structures. Unfortunately, the slight conductivity associated with these films lowers the electrical insulation provided by the film between the metal contacts, ultimately limiting the breakdown voltage of the structure.

Since some sort of insulating film must be between the metal contacts themselves to prevent electrical breakdown, various films such as slightly doped or undoped polysilicon can be deposited therebetween in an effort to redistribute the charge. However, none of these techniques have been shown to be totally effective or reliable. For example, a Motorola device (MOC3060) using such a technique has undergone high temperature reverse bias testing (400 V at 125° C.) and yielded as high as a 25 percent rejection rate.

It would be desirable to develop a method and apparatus for redistributing the accumulated charge at the interface between the field oxide and the silicon substrate which would enhance the depletion region of the high voltage P-N junction, improve electric field termination, and raise electrical breakdown voltage. Such a technique must be compatible with existing semiconductor processing technology and allow for the use of high temperature processing. The present invention is directed towards such a method and apparatus.

SUMMARY OF THE INVENTION

An object of the present invention is to provide for a method and apparatus for dissipating accumulated charge in insulating layers of semiconductor devices. Another object of the present invention is to provide for a method and apparatus which would enhance depletion regions in a semiconductor device and improve the device's breakdown voltage. A further object of the present invention is to provide a process which improves the electrical insulation in a semiconductor structure and which would be fully compatible with existing semiconductor technology and materials.

According to the present invention, a structure for enhancing a depletion region formed in a semiconductor includes an insulating field layer formed on a surface of the semiconductor having first and second spaced P-N junctions formed therein. The insulating field layer extends between the first and second P-N junctions and provides for electrical insulation therebetween. A conductive layer is formed on the insulating field layer from a conductive material and is allowed to electrically float. The conductive layer allows accumulated charge in the insulating layer to dissipate. The structure also includes a passivating layer formed on the insulating field layer and the conductive layer which is in substantial registration with the insulating field layer. The passivating layer receives, at a top surface, first and second metal overlays. The passivating layer provides electrical passivation of the apparatus. The conductive layer is configured on the insulating field layer to be substantially nonregistered and simultaneously fractionally registered with the first and second metal overlays.

DESCRIPTION OF THE PREFERRED EMBODIMENT

Figure 1:
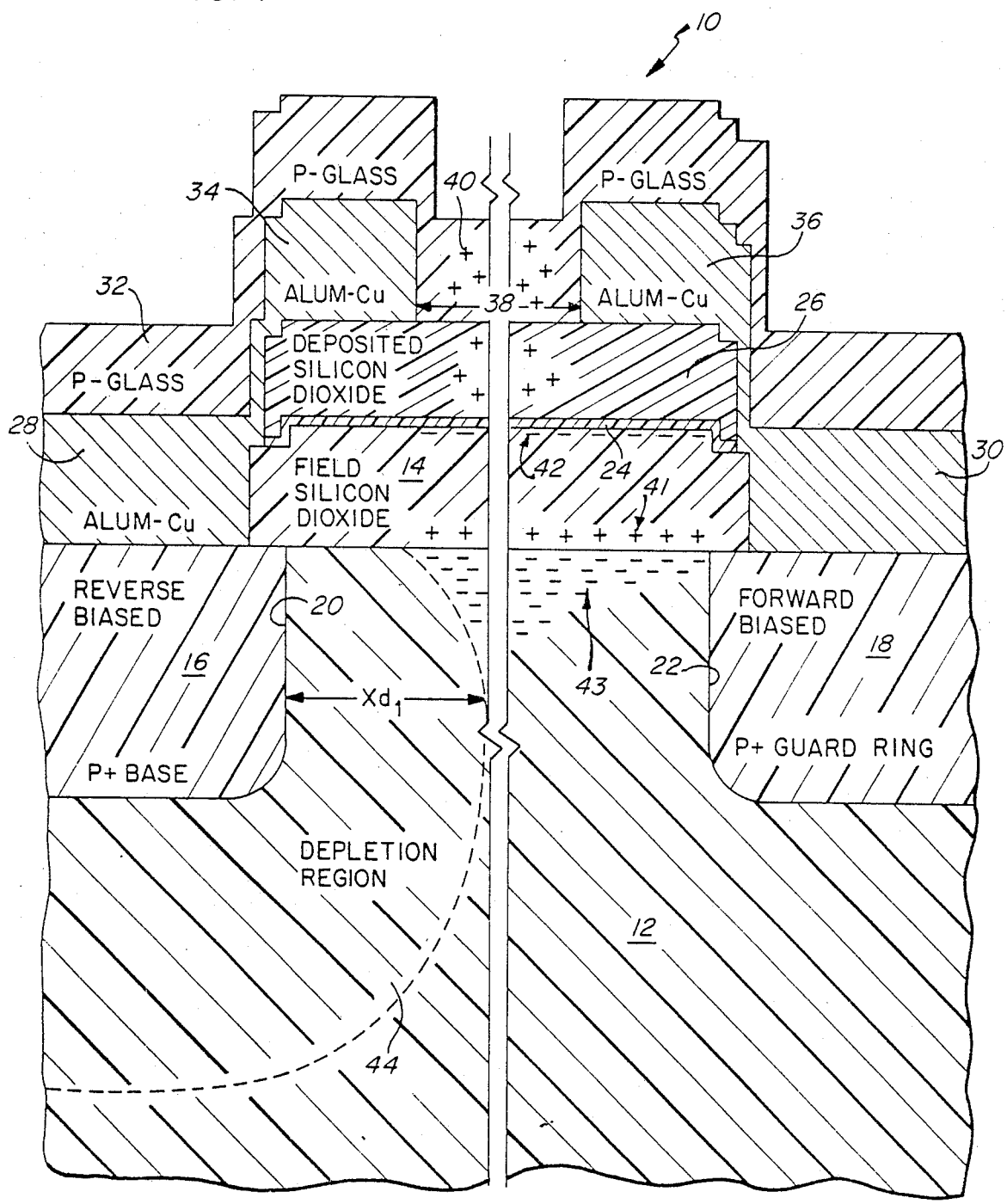
FIG. 1 is a section illustration of a portion of a prior art integrated device using the metal field plate termination technique.

Referring now to FIG. 1, there is illustrated in section a portion of a prior art device 10 that uses the metal field plate termination. The scale of the illustration has been exaggerated for purposes of illustration. The device includes an N-type [111] silicon substrate 12. As is conventional, silicon-dioxide (field oxide) 14 is thermally grown on the substrate and subsequently patterned by a standard photolithographic technique creating openings through the oxide. Diffused therein by conventional techniques is a P+ region 16 and a P+ guard ring region 18. The doping parameters are well known. In this example, the substrate is doped with boron to 200 ohms per square.

As a result of under diffusion, a portion of the field oxide overlaps both the P+ base and P+ guard ring regions, including both P-N junctions 20 and 22. A subsequent silicon-nitride layer 24 approximately 1000 angstroms thick is deposited on the field oxide in order to provide additional protection against mobile ion contamination. Oxide layer 26 is deposited by a conventional low pressure chemical vapor deposition (LPCVD) techniques, and is subsequently patterned so that the silicon-nitride 24 and deposited oxide layer 26 are in substantial registration with the field oxide 14. The deposited oxide 26 provides the additional passivation. Metallized contact layers 28 and 30 are deposited to contact the P+ base and P+ guard ring regions, respectively. The contacts are by themselves conventional, comprising a deposit of aluminum and copper. The contacts are electrically connected to external voltages by openings (not shown) through protective glass layer 32. The protective glass layer is applied to prevent arcing and to provide scratch protection for the surfaces underneath.

As is now conventional, the metal plate contacts overlay the field oxide structure in an effort to improve the breakdown voltage characteristics of the device at very high voltages. The presence of the overlay regions 34 and 36 of metal contacts 28 and 30, respectively, reduces the electric field gradients within the structure, and therefore enhances the junction breakdown voltage. Typically, the overlay region for each metal field plate contact extends over the field oxide by a distance much larger than the junction depth. Gap 38 remains between the metal field plates.

The breakdown voltage is limited because charged particles 40, typically positive, accumulate in the the glass region between the contacts and in the deposited oxide therebelow. Consequently, a corresponding negative charge 42 is accumulated in the field oxide adjacent the interface between the deposited oxide 26 and silicon-nitride layer 24. This problem is most severe in the gap region between the contacts, since the resultant accumulated negative charge is in registration therewith. A corresponding positive charge buildup 41 at the substrate-field oxide interface yields a mirror negative charge 43 within the silicon substrate. When a high reverse bias voltage is applied to the device, the extent of depletion region 44 into the silicon substrate 12 is limited. As is well known, the extent of the depletion region into the substrate is controlled by the extent of the depletion region at the substrate-field oxide interface. This is the reason why charge trapped at the substrate-field oxide interface profoundly effects the breakdown voltage of the device.

In an effort to minimize the charge buildup described hereinabove, prior art structures have relied on a variety of techniques including those which would lessen the overall charge contamination of the insulating films. The high voltage overlay annular diodes taught by D. S. Zoroglu and L. E. Clark in the articles referenced above comprise a slightly conductive insulating film such as polycrystalline silicon deposited between the overlay electrodes. This allows opposing charges to migrate and neutralize the positive charge with the drawback of an ultimately more limited breakdown voltage than provided by an insulating layer.

The problem is further compounded by processing constraints which must be adhered to. As indicated hereinabove, any subsequent structure or additional processing must be fully compatible with existing silicon technology, including very high temperatures. It is especially important to ensure that coefficients of thermal expansion are matched as closely as possible, and that the deposited films retain acceptable adhesion.

Figure 2:
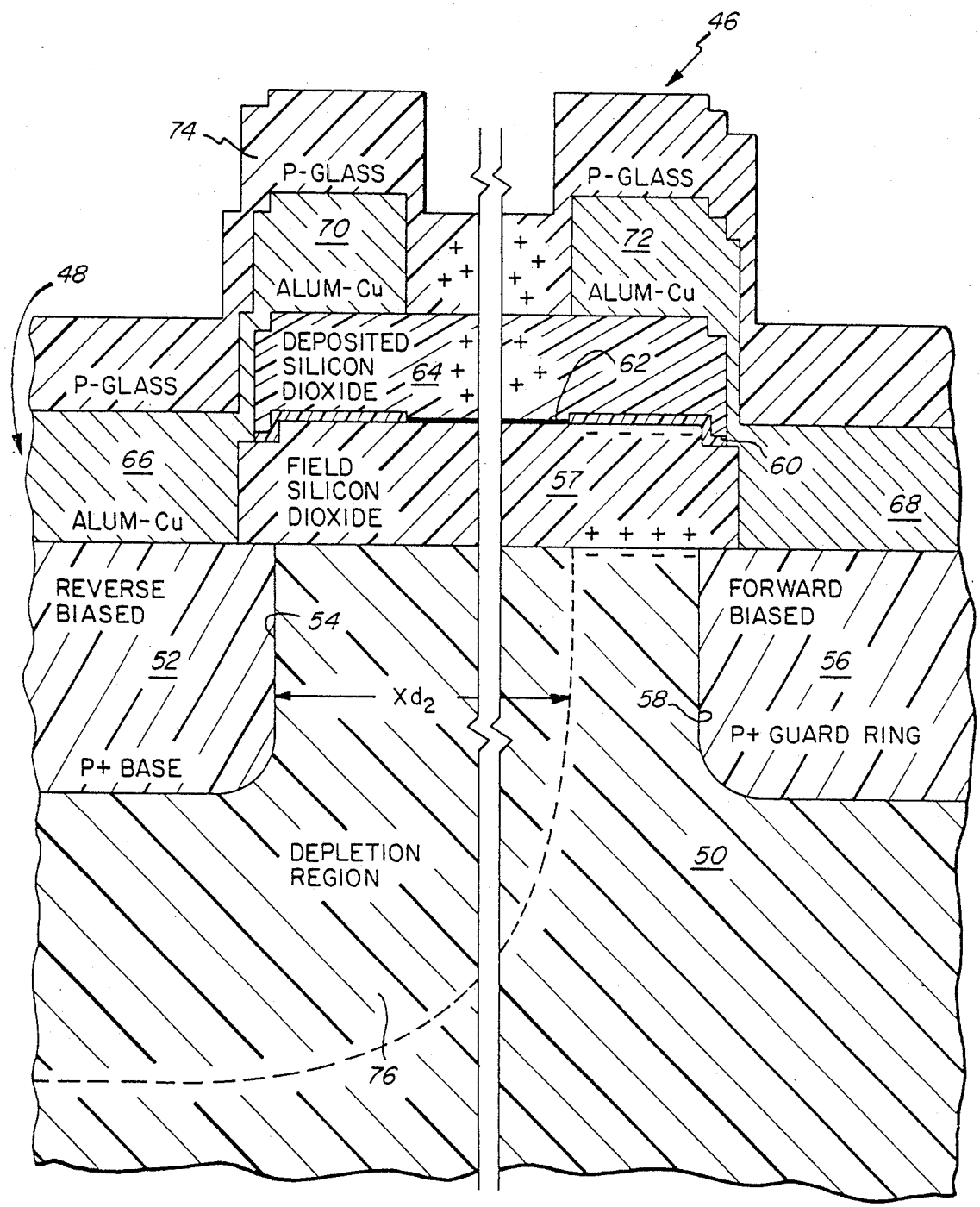
FIG. 2 is a section illustration of a portion of an integrated device having an electrically floating conductive plate provided according to the present invention.

Referring now to FIG. 2, there is illustrated a portion of a semiconductor device 46 having an electrically floating conductive layer provided according to the present invention. As is the case of FIG. 1, the scale of FIG. 2 has been exaggerated for purposes of illustration. In a manner similar to that described with respect to FIG. 1, a field oxide structure 57 is formed by first thermally growing silicon dioxide on the substrate. A reverse bias diode 48 is formed in an N-type [111] silicon substrate 50 and comprises a diffused P+ base region 52 with P-N junction 54. A diffused P+ guard ring region 56 is also formed with P-N junction 58.

A layer of silicon nitride 60 approximately 1000 angstroms thick is subsequently deposited by conventional low pressure chemical vapor deposition (LPCVD) techniques. The silicon nitride is optional, and is used to protect underlying layers from mobile ion contamination, such as sodium ions.

The silicon-field oxide-silicon nitride structure is subsequently patterned by photolithographic techniques to define a region between the P+ diffused regions on which an approximate 100 Angstrom layer of titanium silicide 62 is deposited by conventional deposition techniques such as by sputtering or evaporation. The region covered by the titanium silicide varies with application, but in the device of FIG. 2, the region comprises approximately one-third of the total separation between the base region 52 and guard ring region 56.

The titanium silicide is usually deposited at a much lower temperature (approximately 125° C.) compared with that for the silicon-nitride (approximately 850° C.). Titanium silicide is selected because of both its thermal stability and its resistance to the formation of hillocks (humps) or peeling. Other examples of acceptable substitutes for titanium silicide include molybdenum and tungsten, similarly deposited. These metals are preferable as they all can form a silicide. In general, silicides are characterized by coefficients of thermal expansion which more closely match that of the insulating layers than layers from those conductive materials which do not form silicides. In addition, certain other materials may be selected for the conductive layer, such as conductive ceramics (i.e., silicon carbide) or doped polysilicon.

Subsequently, an oxide layer 64 is deposited over the silicon-nitride/silicon-dioxide structure for electrical passivation. Metalized contacts 66 and 68 are then deposited by sputter or evaporation techniques to contact the base and guard regions 52 and 56, respectively. Both metal contacts include overlay regions 70 and 72 extending onto the field oxide structure from contacts 66 and 68, respectively. A subsequent layer of silicon-dioxide 74 is deposited over the entire structure as a coating for protection against scratches and other environmental contaminations. In the preferred embodiment, both silicon-dioxide layers 64 and 74 comprise P glass with four percent phosphorous doping.

As in the device illustrated in FIG. 1, the metalized contacts extend onto the silicon-nitride silicon-dioxide structure and form overlay regions 70 and 72. In accordance with the present invention, the relationship between the metal overlay regions and the conductive titanium silicide layer 62 is important. In the preferred embodiment, the metal overlay regions 66, 68 each extend over the field oxide structure 57 between the base and guard ring regions 52, 56, respectively, approximately one-third of the total separation therebetween, with the titanium silicide layer occupying the remaining one-third separation. As illustrated in FIG. 2, the titanium silicide is essentially misregistered with the metal overlays. However, the titanium silicide conductive layer extends sufficiently to encompass a portion of each of the metal overlay regions so that there is some amount of registration (fractional registration) between the titanium silicide layer and each of the metal overlays 66 and 68. It is important to note that if the titanium silicide layer is entirely misregistered with the metal overlays, the beneficial effects of the conductive layer will not be present, since charge may still accumulate in that portion of the field oxide structure 57 not registered with either an overlay region or the conductive silicide layer.

The electrically floating conductive plate layer (i.e., titanium silicide 62) cannot be extended all the way across the silicon-nitride silicon-dioxide structure, since it will interfere with the function of both of those structures in reducing electric field gradients.

In operation, P-N junction 54 is reverse biased by a high voltage, and guard ring P-N junction 58 is forward biased. In the preferred embodiment, junction 58 is biased to the substrate potential. A depletion region 76 extends from P-N junction 54, which region is substantially greater in extent into the substrate 50 than the prior art device shown in FIG. 1. As noted with respect to the device of FIG. 1, since the extent of depletion region 76 into the substrate is controlled by the extent of the layer along the silicon dioxide-silicon substrate interface, the removal of trapped charge along the interface dramatically enhances the depletion region. Unlike the guard ring 56, the titanium silicon layer is not electrically connected to any other structure, nor to any external potential. The layer is allowed to electrically float. Electrical charge accumulated in the region between the metal contact overlays 66, 68 can no longer generate a mirror image in the field oxide 57 as happens without the conductive layer. The interface between the field oxide and silicon substrate remains free of accumulated charge, at least as far as the region in registration with titanium silicide layer 62. As a result, the depletion region 76 no longer bends back toward the base region because of the accumulated charges, and the breakdown voltage of the structure is increased substantially.

With a titanium silicide layer or the like ("floating ring") provided according to the present invention, breakdown voltages for the reverse bias junction diode described hereinabove are increased by approximately 200 volts over equivalent structures without such a layer. Moreover, these devices display excellent breakdown voltage characteristics under high temperature reverse bias conditions, since the floating ring is capable of dissipating the additional positive charges collected from the external environment.

Those skilled in the art will note that the present invention is not limited to the preferred embodiment and that the device of FIG. 2 has been selected for illustrative purposes only. The technique provided according to the present invention is applicable for many silicon device applications. These include P-N junction diodes, N-P-N or P-N bipolar transistors, MOS transistors and lateral triac structures. Note that the device of FIG. 2 possesses electrical symmetry and can also be operational if reverse biased, a characteristic which is utilized in a triac device described hereinafter.

Figure 3:
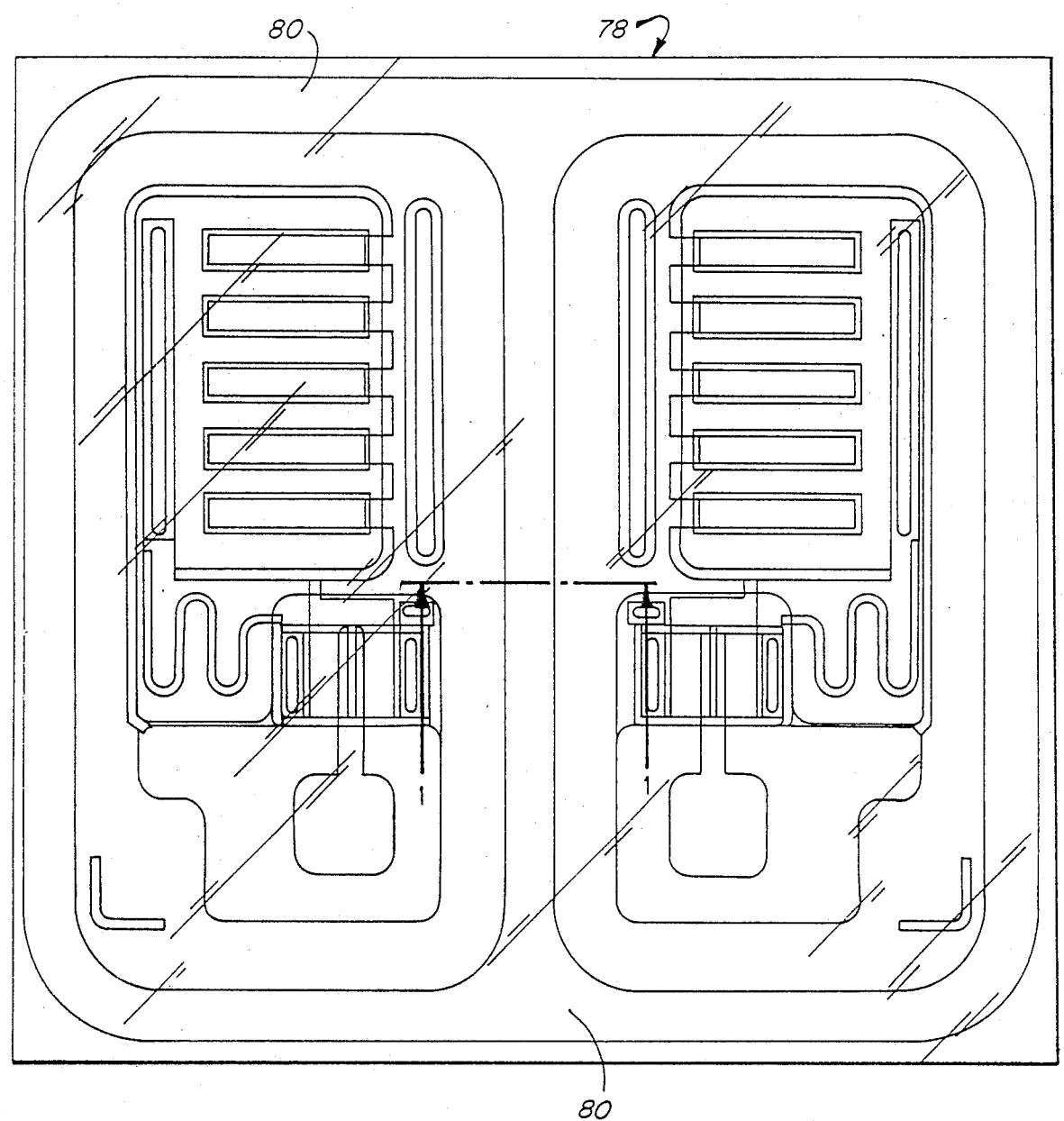
FIG. 3 is a top view of a portion of an integrated triac device having an electrically floating conductive structure provided according to the present invention.
Figure 4:
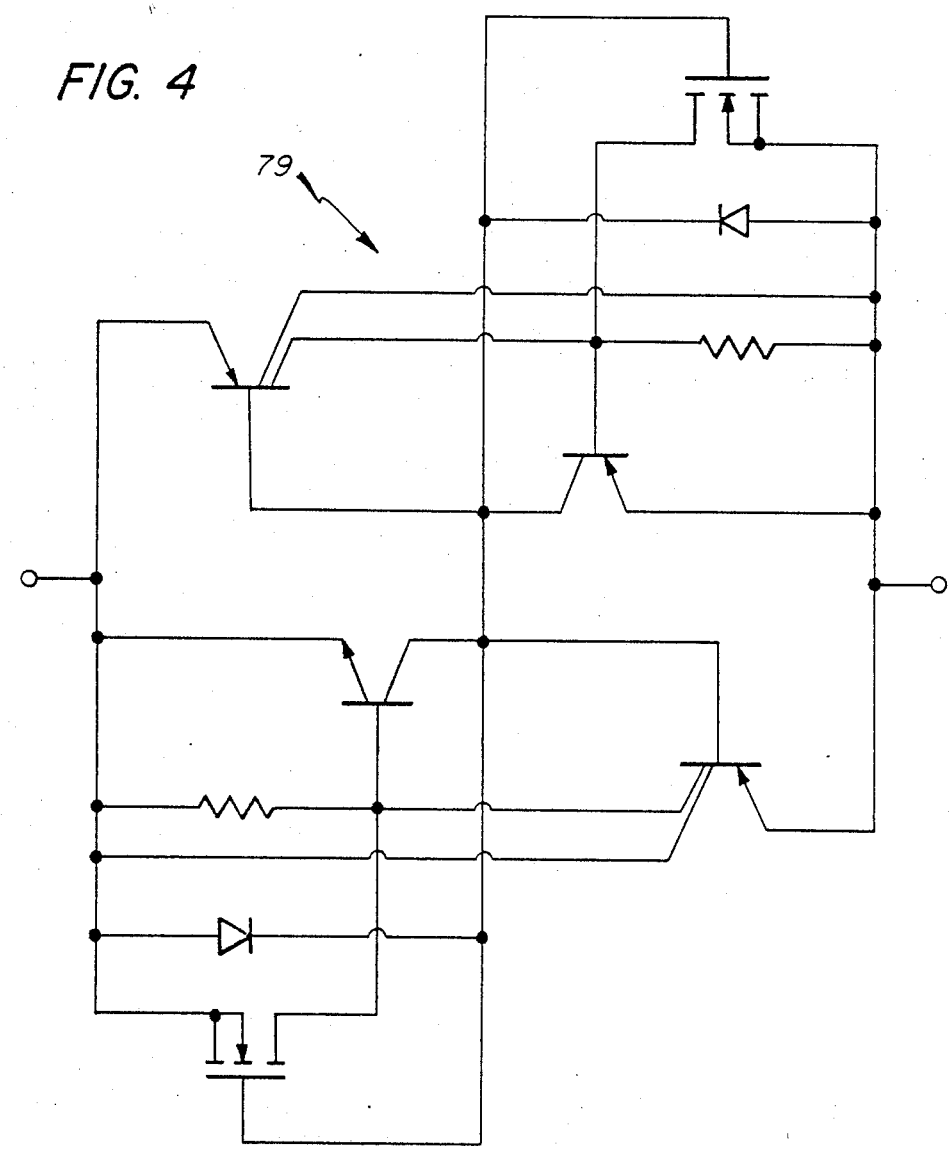
FIG. 4 is a simplified schematic illustration of the equivalent circuit of the triac of FIG. 3.

A further example of the utility and advantages of the present invention can be seen by reference to FIG. 3. FIG. 3 is a top view of a portion of an integrated triac device 78 incorporating the electrically floating conductive structure provided according to the present invention. An equivalent circuit 79 of triac 78 is schematically illustrated in FIG. 4. A family of triac devices marketed by General Instrument Corporation are similar to the device of FIG. 3, but without the features of the present invention. That family includes General Instrument triac MCP 3030 which has a breakdown voltage of approximately 250 V, and triac MCP 3040 whose breakdown voltage is substantially 400 V.

However, in accordance with the present invention, the device of FIG. 3 incorporates a floating guard ring 80 formed of titanium silicide in a manner corresponding to that described hereinabove with respect to FIG. 2. As a result, the breakdown voltage of the triac device has been increased by several hundred volts to 600 V.

Experimentation has shown that when such triacs are fabricated in accordance with the present invention, the number of devices failing high temperature reverse bias testing (600 V at 125° C.) is reduced to less than one percent.

Similarly, although the invention has been described with respect to a best mode embodiment thereof, those skilled in the art will note that additions, deletions or substitutions thereto can be made therein consistent with the spirit and scope of the invention.

I claim:

1. A semiconductor structure having an enhanced region comprising:

field insulating means, formed on a surface of a semiconductor material and extending between first and second spaced P-N junctions formed in said semiconductor material, for providing electrical insulation;

conductive layer means adjacent said field insulating means for dissipating charge accumulated in said field insulating means by remaining at a floating electrical potential within said semiconductor structure;

an insulating layer overlaying said conductive layer means and field insulating means; and first and second conductive contact means arranged to overlay respective portions of said insulating layer, conductive layer, and field insulating means for providing external electrical coupling with said first and second spaced P-N junctions; and wherein said conductive layer means is positioned adjacent said field insulating means to be substantially non-registered and simultaneously fractionally registered with said first and second conductive contact means; and each of said first and second conductive contact means and said conductive layer means extends approximately one-third the distance between said first and second P-N junctions.

2. The apparatus of claim 1 further comprising silicon-nitride insulator means formed between said field insulating means and said insulating layer for providing protection from mobile ion contamination.

3. The apparatus of claim 1 wherein said field insulating means comprises thermal oxide.

4. The apparatus of claim 1 wherein said conductive layer means comprises a metal silicide.

5. The apparatus of claim 4 wherein said metal silicide comprises titanium silicide.

6. The apparatus of claim 1 further comprising a deposited oxide passivating layer overlaying said semiconductor structure.

7. A bipolar semiconductor device comprising:

a substrate having first and second spaced P-N junctions with a substantially uniform doping therebetween and being adapted to host a depletion region between said first and second P-N junctions formed by reverse biasing either one of said P-N junctions and forward biasing the other P-N junction;

field insulating means, formed on a surface of said substrate and bridging the space between said first and second P-N junctions, for providing electrical insulation;

conductive layer means exhibiting a floating electrical potential and located adjacent to said field insulating means for dissipating charge accumulated in said field insulating means and thereby extending said depletion region;

an insulating layer overlaying said conductive layer means and field insulating means; and first and second spaced conductive contact means, electrically connected to said first and second P-N junctions, respectively, and overlaying respective portions of said insulating layer and field insulating means, for providing external electrical coupling with said first and second spaced P-N junctions; and wherein said conductive layer means underlies substantially the entire space between said first and second conductive contact means.

* * * * *